(12) United States Patent
Shinoda et al.

(10) Patent No.: US 10,386,737 B2
(45) Date of Patent: Aug. 20, 2019

(54) IMPRINT APPARATUS AND METHOD FOR PRODUCING ARTICLE

(71) Applicant: CANON KABUSHIKI KAISHA, Tokyo (JP)

(72) Inventors: Ken-ichiro Shinoda, Utsunomiya (JP); Shunsuke Ota, Utsunomiya (JP); Takafumi Miyaharu, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 279 days.

(21) Appl. No.: 15/177,128

(22) Filed: Jun. 8, 2016

(65) Prior Publication Data

US 2016/0363875 A1   Dec. 15, 2016

(30) Foreign Application Priority Data

Jun. 10, 2015  (JP) .................................. 2015-117798
Apr. 25, 2016  (JP) .................................. 2016-087315

(51) Int. Cl.
   *G03F 9/00* (2006.01)
   *G03F 7/00* (2006.01)

(52) U.S. Cl.
   CPC .......... *G03F 9/7042* (2013.01); *G03F 7/0002* (2013.01)

(58) Field of Classification Search
   CPC .... G03F 7/0002; G03F 9/7042; G03F 7/7085; B29C 2059/023; B29C 59/022; B29C 59/026; B29C 59/02; B29K 2995/0027
   USPC ................. 264/40.1, 40.5; 425/150
   See application file for complete search history.

(56) References Cited

U.S. PATENT DOCUMENTS

| | | | | |
|---|---|---|---|---|
| 2012/0292801 | A1* | 11/2012 | Maeda | G03F 9/7042 264/40.5 |
| 2012/0328725 | A1* | 12/2012 | Minoda | G03F 7/0002 425/150 |
| 2013/0093113 | A1* | 4/2013 | Hayashi | G03F 7/0002 264/40.1 |

FOREIGN PATENT DOCUMENTS

| | | |
|---|---|---|
| JP | 2013-089663 A | 5/2013 |
| JP | 2013-102132 A | 5/2013 |
| JP | 2013-102137 A | 5/2013 |
| JP | 2014-241396 A | 12/2014 |
| JP | 2015-008279 A | 1/2015 |
| JP | 2015-029070 A | 2/2015 |
| JP | 2015-056589 A | 3/2015 |

OTHER PUBLICATIONS

Turret—Definition and More from the Free Merriam-Webster Dictionary_2011 (Year: 2011).*

* cited by examiner

*Primary Examiner* — Matthew J Daniels
*Assistant Examiner* — Yunju Kim
(74) *Attorney, Agent, or Firm* — Canon U.S.A., Inc. IP Division (57) ABSTRACT

An imprint apparatus which forms a pattern of an imprint material in a region to be processed on a substrate by using a mold includes an observing unit configured to include a light source which emits first light and a receiving unit which receives the first light which is emitted from the light source, is reflected by the region to be processed, and passes through the mold; a deforming unit configured to thermally deform the region to be processed by illumination with second light; and a combining member which combines the first light of the light source and the second light from the deforming unit and guides the first light and the second light to the region to be processed.

17 Claims, 10 Drawing Sheets

IMPRINT APPARATUS AND METHOD FOR PRODUCING ARTICLE

BACKGROUND OF THE INVENTION

Field of the Invention

The present invention relates to an imprint apparatus and a method for producing an article.

Description of the Related Art

An imprint apparatus is known as an apparatus for forming a fine pattern on a substrate in order to produce a semiconductor device or the like. The imprint apparatus is an apparatus for making an imprint material supplied to the substrate and a mold contact with each other and giving energy for curing to the imprint material to thereby form a pattern of a cured composition onto which a concave-convex pattern of the mold is transferred.

Japanese Patent Laid-Open No. 2013-102132 describes an imprint apparatus having a deforming unit (heating mechanism) configured to illuminate light to thermally deform a region to be processed and curing an imprint material with the region to be processed thermally deformed.

An observing unit configured to illuminate a region to be processed on a substrate with light and receive reflected light of this light to thereby observe the region to be processed is used for an imprint apparatus in some cases. The observing unit observes a state where an imprint material spreads due to a contact of a mold and the imprint material, for example.

SUMMARY OF THE INVENTION

The inventors of the present application found out a suitable configuration for a case where the above-described deforming unit and observing unit are used together, but Japanese Patent Laid-Open No. 2013-102132 in which the observing unit is not described does not describe such a configuration, either.

An imprint apparatus according to one aspect of the invention provides an imprint apparatus and an imprint method which are advantageous for a case where a deforming unit configured to thermally deform a region to be processed on a substrate by light illumination and an observing unit configured to observe the region to be processed are used together.

An imprint apparatus according to one aspect of the invention is an imprint apparatus which forms a pattern of an imprint material in a region to be processed on a substrate by using a mold, including: an observing unit configured to include a light source which emits first light and a receiving unit which receives the first light which is emitted from the light source, is reflected by the region to be processed, and passes through the mold; a deforming unit configured to thermally deform the region to be processed by illumination with second light; and a combining member which combines the first light of the light source and the second light from the deforming unit and guides the first light and the second light to the region to be processed.

Further features of the present invention will become apparent from the following description of exemplary embodiments with reference to the attached drawings.

DESCRIPTION OF THE EMBODIMENTS

First Exemplary Embodiment

[Apparatus Configuration]

Figure 1:
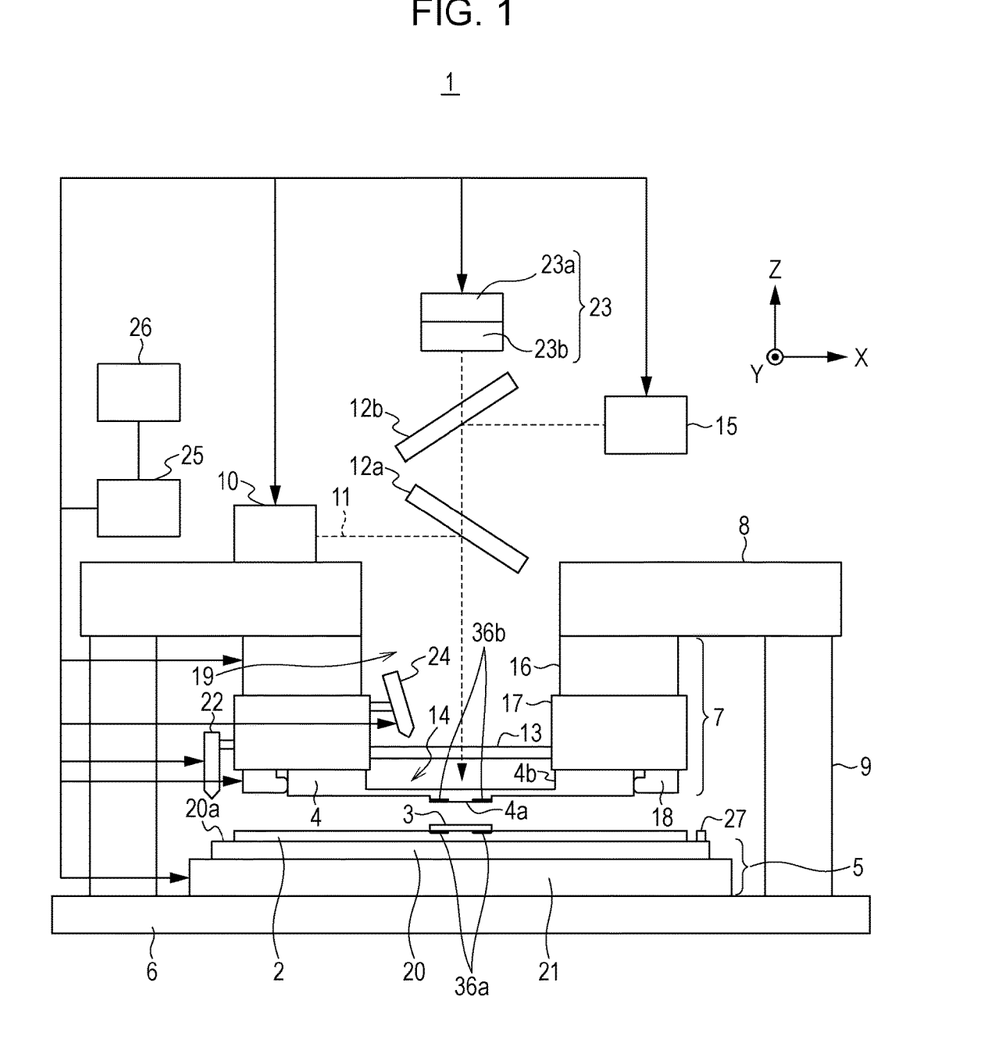
FIG. 1 illustrates a configuration of an imprint apparatus of a first exemplary embodiment.

FIG. 1 illustrates a configuration of an imprint apparatus 1 according to a first exemplary embodiment of the invention. An axis in a vertical direction is defined as a Z-axis and two axes which are orthogonal to each other in a plane vertical to the Z-axis are defined as an X-axis and a Y-axis. The imprint apparatus 1 cures a photo-curable imprint material 3 coated on a substrate 2 while the imprint material 3 and a mold 4 are brought into contact with each other, releases the cured imprint material 3 and the mold 4, and forms a pattern of the imprint material 3 on the substrate 2.

The imprint apparatus 1 includes a base platen 6 on which a substrate stage 5 is placed, a bridge platen 8 for fixing a holding mechanism 7, and a strut 9 which extends in a vertical direction from the base platen 6 and supports the bridge platen 8. An illumination unit 10 emits ultraviolet rays 11 used for curing in a horizontal direction. The ultraviolet rays 11 are reflected on an optical element (for example, a dichroic mirror) 12a vertically and downwardly, and illuminated onto the substrate 2 through the mold 4.

The mold 4 has an outer periphery in a rectangular shape, and has a pattern portion 4a, on which a concave-convex pattern is formed, at a center portion thereof. On the substrate 2, with a single mold pressing operation, a pattern of the imprint material 3 is formed in a pattern region (region to be processed) 31 having a size which is the same as a size of the pattern portion 4a or larger than the size of the pattern portion 4a by several mm for each side.

In the present exemplary embodiment, the pattern region 31 has the same size as that of a shot region (region to be processed). The shot region is a unit region of a base layer in which the pattern has been already formed and a size of one shot region is, for example, about 26 mm×33 mm. One or more patterns having a chip size desired by a user are able to be formed in one shot region.

The mold 4 further has a cavity (concave) 4b having a circular outer periphery around the pattern portion 4a. A transmitting member 13 is arranged so that the ultraviolet rays 11 and heating light pass therethrough and a space 14 enclosed by a part of an aperture region and the cavity 4b is sealed. By regulating pressure in the space 14 by a pressure regulating device (not illustrated) when the pattern portion 4a is pressed against the imprint material 3, the pattern portion 4a is able to be deformed into a downwardly convex shape. This makes it possible to prevent a bubble from being mixed in the concave of the pattern portion 4a when the pattern portion 4a is filled with the imprint material 3.

When the imprint material 3 used for imprinting is photo-curable, the mold 4 needs to be formed of a material through which illumination light for curing is able to pass. Further, the material is required to pass heating light (second light) emitted from a heating mechanism 15 described below. For example, glasses such as quartz glass, silicate-based glass, calcium fluoride glass, magnesium fluoride glass, and acrylic glass may be used. The material of the mold 4 may be sapphire, gallium nitride, and resin such as polycarbonate, polystyrene, acryl, and polypropylene. Alternatively, the material may be laminates comprising any of these materials.

The holding mechanism 7 has a mold chuck 16 for attracting and holding the mold 4 with a vacuum suction force and an electrostatic force, a driving mechanism 17 for moving the mold 4 with the mold chuck 16, and a deforming mechanism 18 for deforming the mold 4. At the center of each of the mold chuck 16 and the driving mechanism 17, an opening region 19 is provided so that the ultraviolet rays 11 from the illumination unit 10 reach the substrate 2.

The deforming mechanism 18 deforms the mold 4 into a target shape by horizontally applying external force to the mold 4. This makes it possible to reduce a difference between a shape of the pattern region 31 on the substrate 2 side (illustrated in FIGS. 3A to 3E) and a shape of the pattern portion 4a and improve overlay precision of the pattern to be formed.

The driving mechanism 17 moves the mold 4 in the Z-axis direction. Thereby, an operation of making the mold 4 and the imprint material 3 contact with each other (mold pressing) and an operation of releasing the mold 4 and the imprint material 3 (mold releasing) are performed. Examples of an actuator adopted for the driving mechanism 17 include a linear motor and an air cylinder. The driving mechanism 17 may be formed of a plurality of driving systems such as a coarse motion driving system and a fine motion driving system. The driving mechanism 17 may include a driving mechanism for moving the mold 4 not only in the Z-axis direction but also in the X-axis direction, the Y-axis direction, and a rotation direction around each of the axes. This makes it possible to perform positioning of the mold 4 precisely.

The substrate stage 5 has a chuck 20 serving as a substrate holding unit for attracting the substrate 2 to a holding surface 20a to hold the substrate 2, and a driving mechanism 21 for moving the substrate 2 with the chuck 20. "Attracting to hold" refers to a state where the chuck 20 is subjected to force other than gravity of the substrate 2 in the same direction as the gravity direction of the substrate 2. The substrate 2 may be held with the electrostatic force or force generated by mechanically pressing the substrate 2 in addition to the vacuum suction force. A reference mark 27 is provided on the substrate stage 5 and is used for alignment of the mold 4.

A patterning unit configured to form a transfer pattern of the pattern portion 4a in the pattern region 31 has a unit configured to control at least mold pressing, curing of the imprint material 3, mold releasing, and the like. The patterning unit in the present exemplary embodiment includes at least the driving mechanism 17, and the illumination unit 10. The pattern is formed while the heating mechanism 15 described below deforms the pattern region 31 based on an illumination profile created by a control unit 25.

The following description further explains FIG. 1. The driving mechanism 21 moves the substrate 2 in an X-Y plane. Thereby, positioning of the mold 4 and the pattern region 31 serving as a base pattern on the substrate 2 is performed. Examples of an actuator adopted for the driving mechanism 21 include a linear motor and an air cylinder. The driving mechanism 21 may include a plurality of driving systems such as a coarse motion driving system and a fine motion driving system. The driving mechanism 21 may include a driving mechanism for moving the substrate 2 not only in the X-axis direction and the Y-axis direction but also in the Z-axis direction and a rotation direction around each of the axes. This makes is possible to perform positioning of the substrate 2 precisely.

An observing portion (observing unit) 23 includes a light source 23a emitting observation light (first light) and a receiving unit 23b receiving the observation light which is emitted from the light source 23a, is reflected by the pattern region 31, and passes through the mold 4. The receiving unit 23b is, for example, an image sensor which captures an image formed by the observation light, such as a CCD. The image formed by the observation light is an interference pattern formed due to interference of light reflected by each of the pattern region 31 and the mold 4 (and/or the imprint material 3). A state of the imprint material 3 is observed from a light receiving result of the receiving unit 23b.

The state of the imprint material 3 includes at least one of an arrangement position of the imprint material 3 arranged on the pattern region 31, a situation of spread of the imprint material 3 due to a contact with the mold 4, presence or absence of a bubble in the imprint material 3, and presence or absence of a foreign substance which is in contact with the imprint material 3.

The observing portion 23 observes the pattern region 31 until the pattern portion 4a is set in a direction along the substrate 2 after the pattern portion 4a which has a downwardly convex shape starts making a contact with the imprint material 3, that is, during a contact operation of the mold 4 and the imprint material 3. In this manner, the observing portion 23 observes a situation where the imprint material 3 is pressed and spread by the pattern portion 4a.

A time period indicated by "during the contact operation" is a time period between a first timing which is a timing when the mold 4 is scheduled to start making a contact with the imprint material 3 and a second timing when the mold 4 is scheduled to be set in the direction along the substrate 2. The first timing and the second timing may be obtained by observing a shape of the pattern portion 4a and may be managed as a predetermined time after the mold 4 is started to become close to the pattern region 31 in a Z-direction.

In addition, particles put between the pattern portion 4a and the substrate 2 may be detected based on the light receiving result of the receiving unit 23b. The pattern region 31 may be observed also when the mold 4 is released from the imprint material 3.

The heating mechanism 15 is a deforming unit configured to illuminate the pattern region 31 with heating light and thermally deform the pattern region 31. The heating mechanism 15 of the present exemplary embodiment gives a heat value corresponding to an illumination profile to the pattern region 31 by controlling illumination of light. The pattern region 31 is heated and deformed so as to approximate the shape thereof to a target shape. It is possible to reduce a difference between the shape of the pattern region 31 and the shape of the pattern portion 4a even in a case where the pattern portion 31 is distorted in a shape including a deformation component such as a magnification component, a parallelogram component, or a trapezium component. It is thereby possible that the pattern region 31 is overlaid with a pattern, which is newly formed on the pattern region 31, with high precision.

Figure 2:
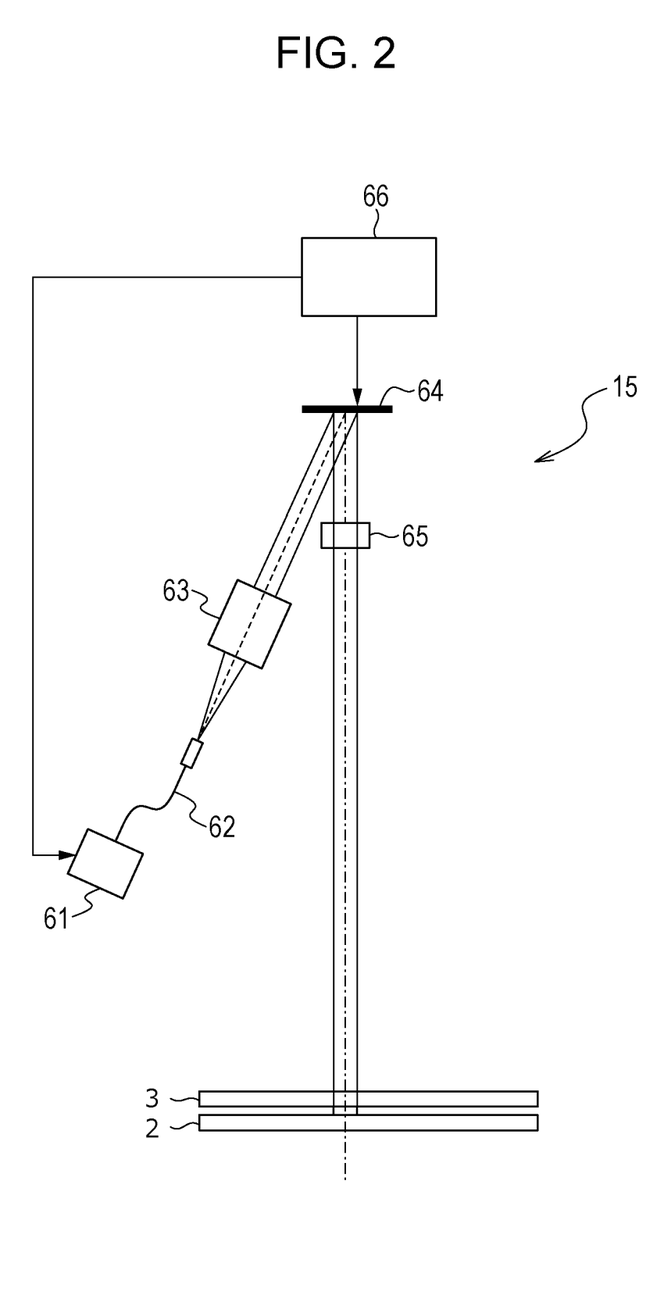
FIG. 2 illustrates a configuration of a heating mechanism of the first exemplary embodiment.

FIG. 2 illustrates a configuration of the heating mechanism 15. A light source 61 emits heating light. A wavelength of the heating light is desired to be a wavelength by which the uncured imprint material 3 is not cured and which allows absorption as heat on the substrate 2. For example, the desired wavelength is 400 nm to 2000 nm. The heating light is incident on a DMD (Digital Micro-mirror Device) 64 through an optical fiber 62 and an optical system 63 and only the heating light selectively reflected by the DMD 64 is illuminated onto the substrate 2.

The optical element 12a which reflects the ultraviolet rays 11 emitted from the illumination unit 10 and passes the heating light and the observation light therethrough is arranged in an optical path of the heating light. An optical element 12b serving as a combining member which combines the observation light emitted by the light source 23a and the heating light from the heating mechanism 15 and guides the observation light and the heating light to the pattern region 31 is further arranged.

For example, a high-output semiconductor laser is used for the light source 61. The optical system 63 includes a collective optical system (not illustrated) for collecting light emitted from the light source 61, and a uniform illumination optical system (not illustrated) for uniformizing an intensity of light from the collective optical system and illuminating the DMD 64. The uniform illumination optical system includes an optical element, for example, such as a micro lens array (MLA) (not illustrated).

The DMD 64 includes a plurality of micro mirrors (not illustrated) for reflecting the heating light. An illumination control unit 66 is able to incline each of the micro mirrors at an angle of −12 degrees (on state) or +12 degrees (off state) to a surface on which the micro mirrors are arrayed.

The heating light reflected by the micro mirror in the on state is imaged on the substrate 2 by an optical projection system 65 which provides a conjugation relation between the DMD 64 and the substrate 2. The light reflected by the micro mirrors in the off state is reflected in a direction not reaching the substrate 2. In the present exemplary embodiment, all sizes of regions in which the heating light reflected by the micro mirrors in the on state is projected on the substrate 2 are the same as an ideal size of the pattern region 31. However, the sizes are not required to be necessarily the same and the sizes of the regions in which the heating light is projected on the substrate 2 may be larger than the ideal size of the pattern region 31.

When the heating mechanism 15 causes distribution of a region in which the heating light is illuminated and a region in which the heating light is not illuminated in one pattern region 31, it is possible to locally deform the pattern region 31.

The illumination control unit 66 has a CPU and selectively controls switching of the on state and the off state of each of the micro mirrors based on an illumination profile (heating distribution data indicating heating distribution) instructed from the control unit (generation unit, obtaining unit) 25 described below.

The illumination profile is a profile indicating, for example, temporal and spatial heating distribution by the on state and the off state of each of the micro mirrors. The illumination profile includes information about times of the on state and the off state, and illumination distribution according to a position in the pattern region 31 formed by the distribution of the on state and the off state. As the number of micro mirrors in the on state increases and as an illumination time of the heating light becomes long, a greater heat value is able to be applied to the pattern region 31 on the substrate 2.

Figure 3A:
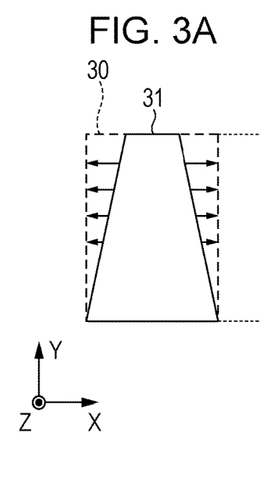
FIGS. 3A to 3E are diagrams for explaining shape correction by the heating mechanism.

FIGS. 3A to 3D illustrate one example of relationships between the illumination profile and the pattern region 31. As illustrated in FIG. 3A, the pattern region 31 is distorted by including a trapezium component only in one direction (X-direction). In order to reduce a difference from the shape of the pattern portion 4a, it is necessary to approximate the shape of the pattern region 31 to a rectangle 30 by expanding an upper side. In this case, as the illumination profile illustrated in FIG. 3B, the illumination distribution and the illumination time are set so that the illumination amount applied to a vicinity of the upper side increases. That is, illumination distribution 32 is formed only in the Y-direction and uniform illumination is provided in the X-direction.

Figure 3B:
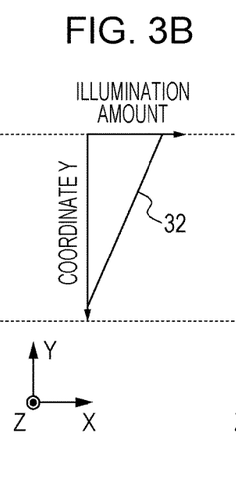
Figure 3C:
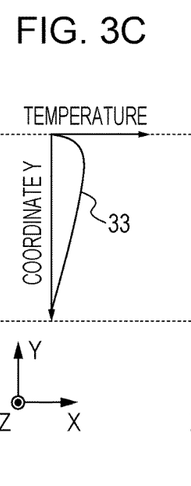
Figure 3D:
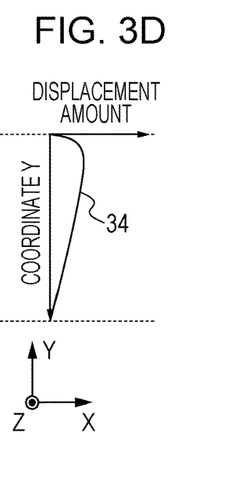
Figure 3E:
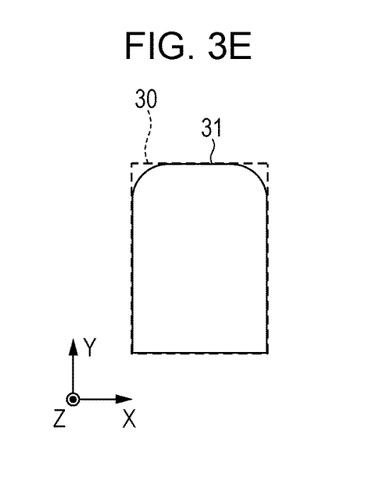

When the heating light is illuminated based on the illumination distribution 32 illustrated in FIG. 3B, temperature distribution 33 illustrated in FIG. 3C is formed in the pattern region 31 and the shape of the pattern region 31 changes with displacement distribution 34 illustrated in FIG. 3D. This makes it possible to correct the shape of the pattern region 31 as illustrated in FIG. 3E. When the pattern region 31 has only isotopic magnification component, the illumination profile is only required to allow providing of uniform temperature distribution in the pattern region 31.

An element other than the DMD 64 may be used as long as an element capable of deforming the pattern region 31 with distribution in the same manner as the DMD 64. For example, an LCD (Liquid Crystal Display) may be used.

The following description further explains the imprint apparatus 1 with reference to FIG. 1. A coating unit 22 coats the pattern region 31 on the substrate 2 with the imprint material 3 in the uncured state. Only an amount of the imprint material 3 needed for single operation of mold pressing operation is used for single coating. Therefore, each time the mold pressing operation is finished, the substrate stage 5 reciprocates the substrate 2 between a position of the mold pressing and a lower position of the coating unit 22.

An alignment system (detection unit) 24 detects at least a plurality of marks 36a provided in the pattern region 31 by causing detection light emitted from the alignment system 24 to interfere. In the present exemplary embodiment, the marks 36a provided around the pattern region 31 and marks 36b provided in the pattern portion 4a are detected simultaneously.

The detection of the marks 36a and 36b is performed before the mold 4 and the imprint material 3 on the substrate 2 are brought into contact with each other (while the mold 4 is descending) and until just before the imprint material 3 is cured also during a contact operation. The alignment system 24 may have a driving mechanism capable of withdrawing so as to allow moving to an outside of an optical path of the ultraviolet rays 11 while the imprint material 3 is being cured.

Note that, the marks used for positioning may be changed before and after the mold 4 and the imprint material 3 are brought into contact with each other.

The marks 36a are only required to allow grasping of the shape of the pattern region 31 by detection of the plurality of marks 36a. The marks 36a may be formed in the pattern region 31, or may be formed on a scribe line adjacent to the pattern region 31 as described above. The alignment system 24 includes a plurality of scopes and detects the plurality of marks 36a and 36b in synchronism.

Based on a detection result of the alignment system 24, the control unit 25 described below obtains positional shifts (shift components) of the marks 36a and 36b in the X-axis direction, the Y-axis direction, and the ωZ-direction. The control unit 25 further detects an amount of change in the shape of the magnification component of the pattern region 31. Moreover, based on positional changes of the marks 36a before and after the heating mechanism 15 thermally deforms the substrate 2, the control unit 25 is able to obtain the amount of change in the shape of the pattern region 31 (second information about deformation of the region to be processed, second information about thermal deformability).

Moreover, the alignment system 24 may have a relay optical system. In this case, an optical path of light of the detection of the marks 36a and 36b may be an optical path common to the ultraviolet rays 11.

The control unit 25 is connected to the illumination unit 10, the heating mechanism 15, the observing portion 23, the holding mechanism 7, the substrate stage 5, the coating unit 22, the alignment system 24, and a storage unit 26 through a line, and integrally controls the aforementioned control targets. Patterns are formed successively by repeating the mold pressing operation with respect to a plurality of pattern regions 31 on the substrate 2.

The control unit 25 executes programs stored in the storage unit 26, which are illustrated in a flowchart of FIG. 4 described below, by controlling the aforementioned control targets connected to the control unit 25. The control unit 25 reads a variable needed for the control of the control targets from the storage unit 26 or stores the variable in the storage unit 26.

The control unit 25 may be disposed in a housing commonly used with other components of the imprint apparatus 1, or may be disposed outside the housing. The control unit 25 may be an aggregation of control substrates different for each of the control targets.

The control unit 25 has a function as an obtaining unit which obtains first information and second information. The first information is information defined based on a difference of the shapes of the pattern region 31 and the pattern portion 4a, and the second information is information about a deformation amount of the pattern region 31 obtained by trying deformation of the pattern region 31 by the heating mechanism 15 while the chuck 20 is attracting the substrate 2. The control unit 25 further has a function as a generation unit which generates an illumination profile used for pattern formation based on the first information and the second information.

In particular, the first information according to the present exemplary embodiment is a standard illumination profile defined based on a difference between the shape of the pattern portion 4a and the shape of the patter region 31, which is obtained based on the detection result of the marks 36a and 36b by the alignment system 24. The standard illumination profile is also referred to as first information defined based on a difference of the shapes of the pattern region 31 and the pattern portion 4a of the mold 4. The standard illumination profile is also referred to as temporal heating distribution data temporarily generated based on the difference of the shapes of the pattern region 31 and the pattern portion 4a of the mold 4.

The second information according to the present exemplary embodiment is a correction value (correction coefficient) for correcting the standard illumination profile. The heating mechanism 15 heats the pattern region 31 based on an illumination profile obtained by correcting the standard illumination profile to thereby deform the pattern region 31 so as to reduce the difference between the shape of the pattern region 31 and the shape of the pattern portion 4a.

The "standard illumination profile" is an illumination profile defined based on the difference of the shapes of the pattern portion 4a of the mold 4 and the pattern region 31 and the deformation amount of the substrate 2 per unit heat value in a state where the chuck 20 does not suck the substrate 2 (or a state of uniformly sucking the substrate 2). That is, the same standard illumination profile is allocated to the pattern regions 31 having the same shape.

Figure 4:
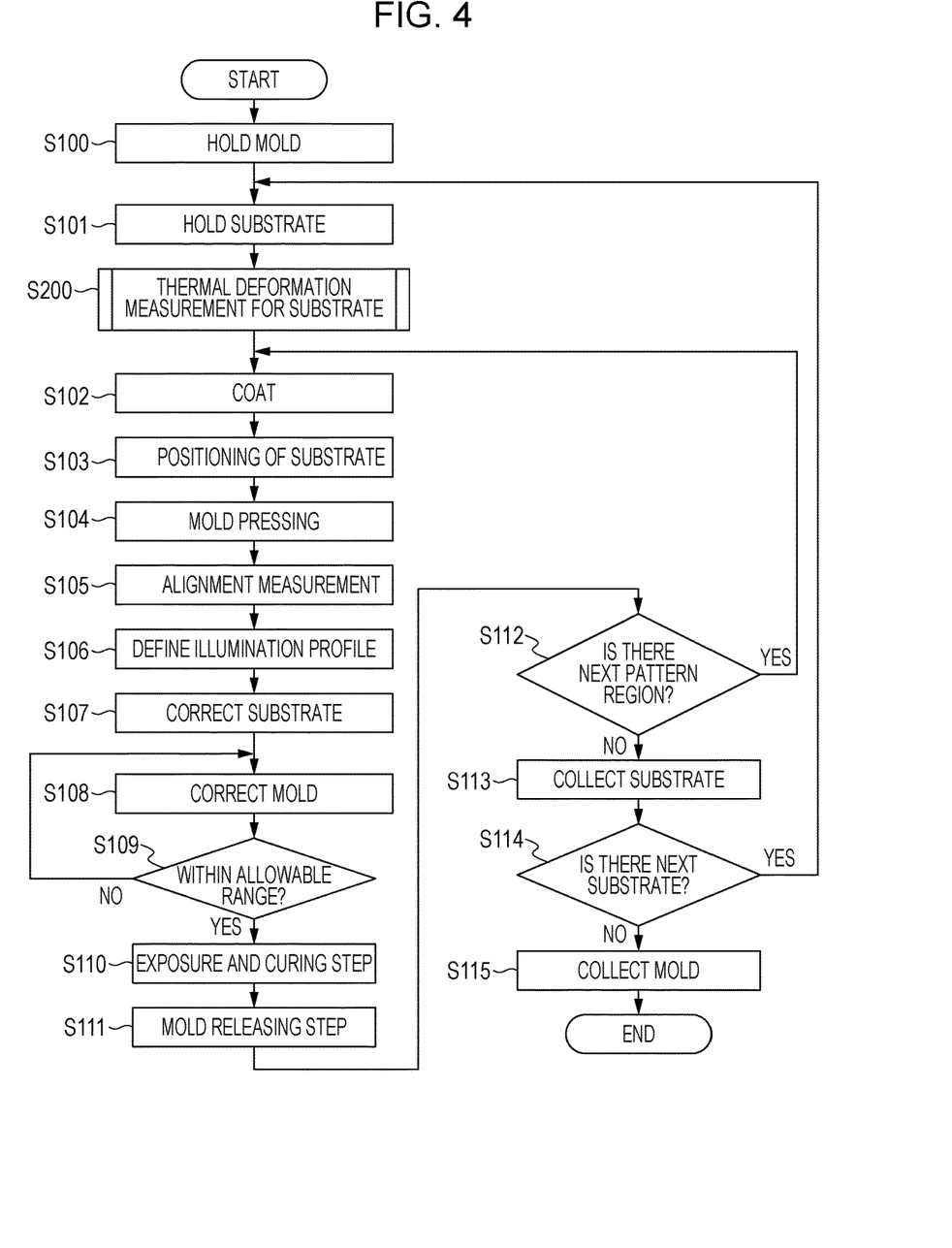
FIG. 4 is a flowchart illustrating a flow of a measurement method.

The storage unit 26 stores therein the programs illustrated in the flowchart of FIG. 4, and a deformation amount of the substrate 2 per unit heat value. The storage unit 26 stores therein the detection result by the alignment system 24, and a position of the pattern region 31 for correcting the standard illumination profile and an amount of change in the shape of each pattern region 31, which are obtained by thermal deformation measurement described below, during a consecutive operation for pattern formation. Further, the storage unit 26 stores therein a correction amount of the illumination profile for each pattern region 31, which is obtained by the control unit 25.

(Imprint Method)

Next, an imprint method according to the present exemplary embodiment will be described. The present exemplary embodiment is an exemplary embodiment in which a required illumination profile varies between the pattern regions 31 and thermal deformation measurement is performed before mold pressing (before making the mold and the imprint material contact with each other) in the operation for pattern formation.

Note that, the "operation for pattern formation" in the following description refers to an operation from when one pattern region 31 is coated with the imprint material 3 until a mold releasing step of detaching the mold 4 from the imprint material 3 is performed after a mold pressing step and a curing step are performed. The "thermal deformation measurement" refers to an operation for measuring the deformation amount of the shape of the pattern region 31 when the substrate 2 is thermally deformed while the chuck 20 is sucking (attracting) the substrate 2.

FIG. 4 is a flowchart illustrating steps of imprint processing.

First, the control unit 25 causes the mold chuck 16 to hold the mold 4 by suction (S100). After S100 or simultaneously with S100, the control unit 25 causes the chuck 20 to hold the substrate 2 by suction (S101). Then, while maintaining the sucked state, the control unit 25 performs thermal deformation (trying deformation) for the substrate 2 by using the heating mechanism 15 and controls the alignment system 24 to perform thermal deformation measurement of the pattern region 31 (S200). At a trying deformation step in the step of S200, since the substrate 2 is deformed with the standard illumination profile, the curing step of the imprint material 3 is not performed.

With a measurement step of S200, the control unit 25 obtains a correction value for correcting the standard illumination profile (second information about deformation of a region to be processed) for each pattern region 31.

The control unit 25 controls the substrate stage 5 to drive the substrate 2 to a coating position of the imprint material 3 and causes the coating unit 22 to coat the pattern region 31 subjected to mold pressing first with the imprint material 3

(S102). The control unit 25 controls the substrate stage 5 to move the substrate 2 to a position facing the mold 4 (hereinafter, referred to as a mold pressing position) (S103). The control unit 25 controls the holding mechanism 7 to lower and press the mold 4 to the imprint material 3 (S104).

The alignment system 24 detects the marks 36a and 36b (S105), and slightly drives the substrate stage 5 to relatively position the mold 4 and the substrate 2. The control unit 25 obtains a difference between the pattern portion 4a and the pattern region 31 based on a detection result at S105. Thereby, the control unit 25 obtains a condition for correction of the shape of the mold 4 by the deforming mechanism 18, and a standard illumination profile for correction of the shape of the pattern region 31.

Further, by using the standard illumination profile and the correction value for correcting the standard illumination profile obtained at the step of S200, an illumination profile needed for thermal deformation of the pattern region 31 is defined (S106).

Subsequently, the control unit 25 controls the heating mechanism 15 to heat the inside of the pattern region 31 in accordance with the illumination profile defined at the step of S106 (S107). Thereby, a temperature of the pattern region 31 locally increases by about 1 degree at maximum. The substrate 2 is locally deformed by heating and the pattern region achieves a target shape. After S106 or simultaneously with S106, the control unit 25 controls the deforming mechanism 18 of the mold 4 to mechanically deform the mold 4 to a target shape (S108). Note that, though the pattern region 31 is heated also at the step of S200, the deformation caused at the step of S200 is returned to an original state in around several seconds.

At the steps of S107 and S108, the control unit 25 causes the alignment system 24 to detect the marks 36a and 36b simultaneously. Based on the detection result, the control unit 25 judges whether a residual of the shape of the pattern region 31 and the shape of the pattern portion 4a is within an allowable range (S109). When judging that the residual of the shapes is not within the allowable range (NO), the control unit 25 further corrects the shape of the mold 4 by returning to S108.

When judging that the residual of the shapes is within the allowable range (YES), the control unit 25 controls the illumination unit 10 to illuminate the pattern region 31 with the ultraviolet rays 11 as an exposure step (S110). At a timing when the imprint material 3 is cured by the illumination of the ultraviolet rays 11 and the curing of the imprint material 3 is finished, the mold 4 is detached from the imprint material 3, so that a pattern is formed on the substrate 2 (S111).

The control unit 25 judges whether or not the same substrate 2 has the pattern region 31 in which the pattern is to be formed continuously (S112). When the control unit 25 judges that there is no corresponding pattern region 31 (NO at S112), the substrate 2 on the chuck 20 is carried out by a conveying mechanism (not illustrated) (S114).

When the control unit 25 judges that there is the corresponding pattern region 31 (YES at S112), the steps S102 to S112 are repeated. After the substrate 2 is carried out at S114, whether or not there is the substrate 2 to be processed with the same mold 4 is judged (S115), and when it is judged that there is the substrate 2 to be processed (YES at S115), the steps S101 to S114 are repeated.

Note that, the step of thermal deformation measurement of the pattern region 31 (S200) is not necessarily required to be carried out in the above description. In a case where the step of thermal deformation measurement is not carried out, the imprint material 3 may be cured in a state where S106 is not carried out and the pattern region 31 is deformed based on the standard illumination profile at the step of S107 (S110).

(Configurations of Various Optical Systems)

Configurations of various optical systems of the imprint apparatus 1 will be described. In the present exemplary embodiment, a wavelength band of the heating light is different from a wavelength band of the observation light. Thus, a dichroic mirror is used as the optical element 12b. The optical element 12b transmits the observation light emitted from the light source 23a of the observing portion 23 and reflects most of the heating light toward the substrate 2, so that a part of an optical path of the observation light and a part of the optical path of the heating light are common.

The observation light is desired to be light having a wavelength included in a wavelength band which is equal to or more than a wavelength, with which the imprint material 3 is not cured, and equal to or less than 500 nm. The heating light is desired to be light having a wavelength included in the wavelength band which is equal to or more than the wavelength, with which the imprint material 3 is not cured, and equal to or less than 500 nm, and light having a wavelength which is different from those of the observation light and the detection light. Since the heating light requires to be illuminated with higher illumination compared with the observation light and the detection light, the light source 23a which emits the heating light is desired to be a high-output laser or a laser diode.

The detection light of the alignment system 24 is light having a wavelength with which the imprint material 3 is not cured. In addition, the detection light is desired to have a wavelength band as wide as possible. This is for, even in a case where interference light and light having a specific wavelength band weakens each other depending on types of a material laminated on the substrate 2 and a configuration thereof, precisely detecting the marks 36a and 36b by causing light having a wavelength band different from that of the light having the specific wavelength band to interfere with the detection light. Accordingly, the detection light is desired to include light having a wavelength band of 400 nm to 1000 nm, but only needs to consecutively or separately include light having a wavelength band of 550 nm to 750 nm.

For a light source of the alignment system 24, a light source which outputs white light may be used or a plurality of light sources (such as light emitting diode or laser diode) whose wavelength bands are dozens of nm or several nm may be combined. When the optical path of the detection light by the alignment system 24 has an optical path common to that of the observation light or the heating light, light having a wavelength band different from those of the observation light and the heating light is used as the detection light.

For example, light having a wavelength of 300 nm to 380 nm is used as the ultraviolet rays 11, light having a wavelength of 400 nm to 440 nm is used as the observation light, light having a wavelength of 480 nm is used as the heating light, and light having a wavelength of 550 nm to 1000 nm is used as the detection light. In this case, a dichroic mirror in which reflectance of light having a wavelength equal to or more than 450 nm is higher than transmittance thereof and transmittance of light having a wavelength less than 450 nm is higher than reflectance thereof is used as the optical element 12b.

In this manner, by combining the heating light and the observation light by the optical element 12b, it is possible to cause the imprint apparatus 1 to use the heating mechanism 15 and the observing portion 23 together. That is, it is possible to realize that both functions of observing the substrate 2 and heating the pattern region 31 by the heating mechanism 15 are used together. Further, compared with a case where the observing portion 23 and the heating mechanism 15 are to be arranged individually, increase in sizes of the optical systems is suppressed. The common optical path of the heating light and the observation light is made common also to the optical path of the ultraviolet rays 11 and also to the optical path of the detection light, so that it is possible to further simplify the optical systems.

In a case where at least a part of the wavelength band of the heating light and at least a part of the wavelength band of the observation light overlap, the observation light emitted by the light source 23a and the heating light from the heating mechanism 15 are combined. In this case, a mirror which transmits a part of light incident on the mirror and reflects the residual light in a predetermined direction may be used as the optical element 12b.

Note that, arrangement of the observing portion 23 and the heating mechanism 15 may be reversed. In the case of the reversed arrangement, a dichroic mirror which has a characteristic that reflectance of the observation light is greater than reflectance of the heating light is desired to be used as the optical element 12b. Additionally, arrangement of the illumination unit 10, the alignment system 24, the observing portion 23, and the heating mechanism 15 may be changed. When the arrangement is changed, characteristics of the optical element 12a and the optical element 12b are changed so that light which is illuminated to the pattern region 31 and reflected by the pattern region 31 or the mold 4 returns to a predetermined constituent member. For example, the characteristics are changed so that the observation light is incident on the receiving unit 23b and the detection light is incident on a receiving unit of the alignment system 24.

Second Exemplary Embodiment

Figure 5:
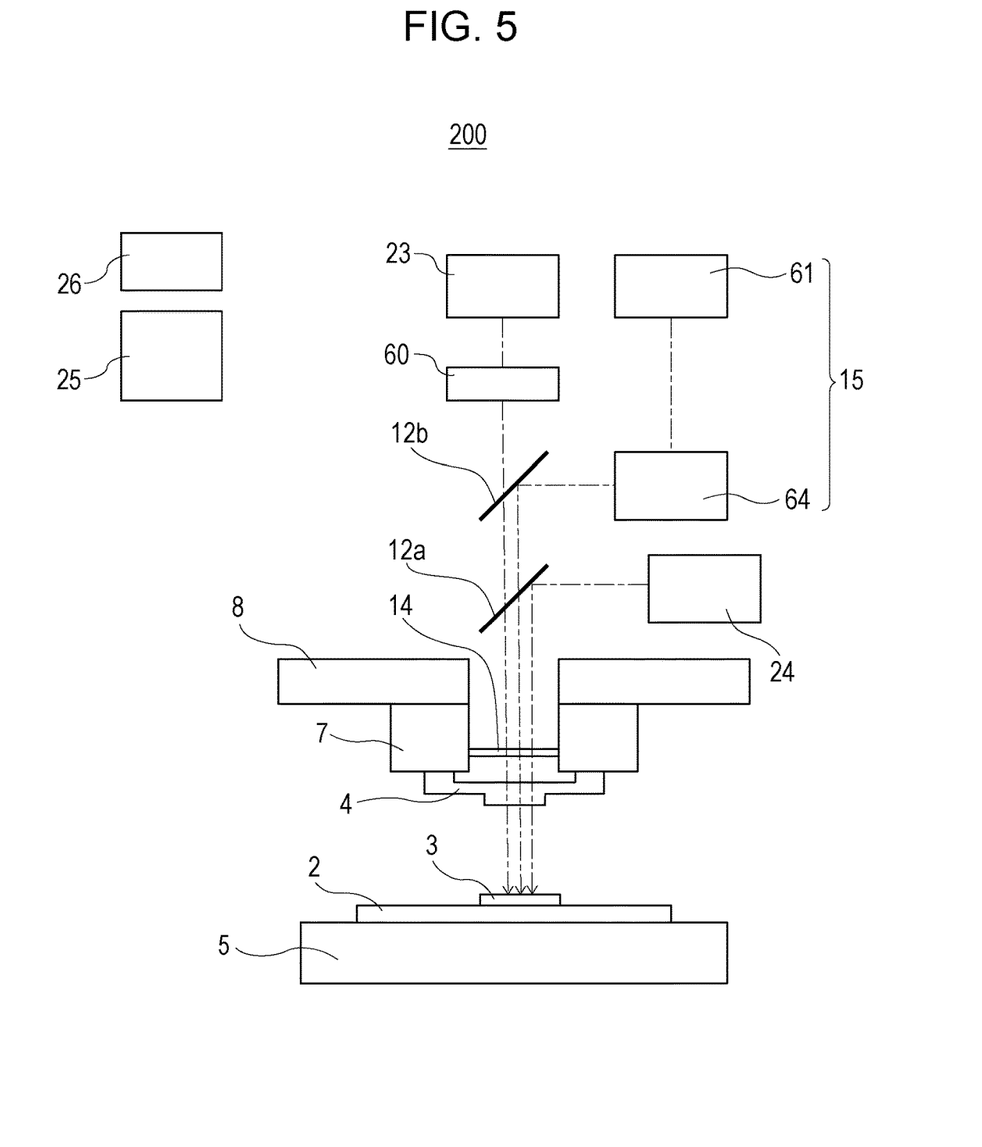
FIG. 5 illustrates a configuration of an imprint apparatus of a second exemplary embodiment.

FIG. 5 illustrates a configuration of an imprint apparatus 200 according to a second exemplary embodiment. The imprint apparatus 200 is arranged on the optical path of the observation light directed to the receiving unit 23b from the optical element 12b, and has an optical element (optical member) whose transmittance of observation light is higher than transmittance of heating light. As this optical element, a band pass filter (wavelength selecting unit) 60 is used, for example. As to the heating mechanism 15, only the light source 61 and the DMD 64 are illustrated, and illustration of the other optical systems is omitted. Illustration of the illumination unit 10 is also omitted. The other configurations are similar to those of the first exemplary embodiment.

The band pass filter 60 preferably has a characteristic of transmittance of heating light equal to or less than 10%, and more preferably equal to or less than 1%. In addition, the band pass filter 60 preferably has a characteristic of transmittance of observation light equal to or more than 80%, and more preferably equal to or more than 95%. By allowing the observation light to be incident on the receiving unit 23b with high efficiency, it is possible to maintain a degree of image pickup equivalent to resolution of a result of image pickup in a case where the band pass filter 60 is not included.

The heating light is illuminated to the pattern region 31 with higher illumination than those of the observation light and the detection light. For example, the heating light is illuminated to the pattern region 31 with illumination of several thousand W/m$^2$. This illumination corresponds to 1000 times of that of the observation light or more. The band pass filter 60 is arranged on the optical path of the observation light directed to the receiving unit 23b from the optical element 12b.

Thereby, a little heating light is attenuated. The little heating light is caused when a part of heating light reflected by the pattern region 31 is incident on the optical element 12b and further passes through the optical element 12b without being reflected. By attenuating the heating light directed to the receiving unit 23b, it is possible to prevent the receiving unit 23b from being damaged due to the heating light which reaches the receiving unit 23b.

In a case where the band pass filter 60 is arranged on the optical path of the ultraviolet rays 11 due to a change in arrangement of the illumination unit 10, the alignment system 24, the observing portion 23, or the heating mechanism 15, the band pass filter 60 which has a different characteristic is used.

Third Exemplary Embodiment

Figure 6:
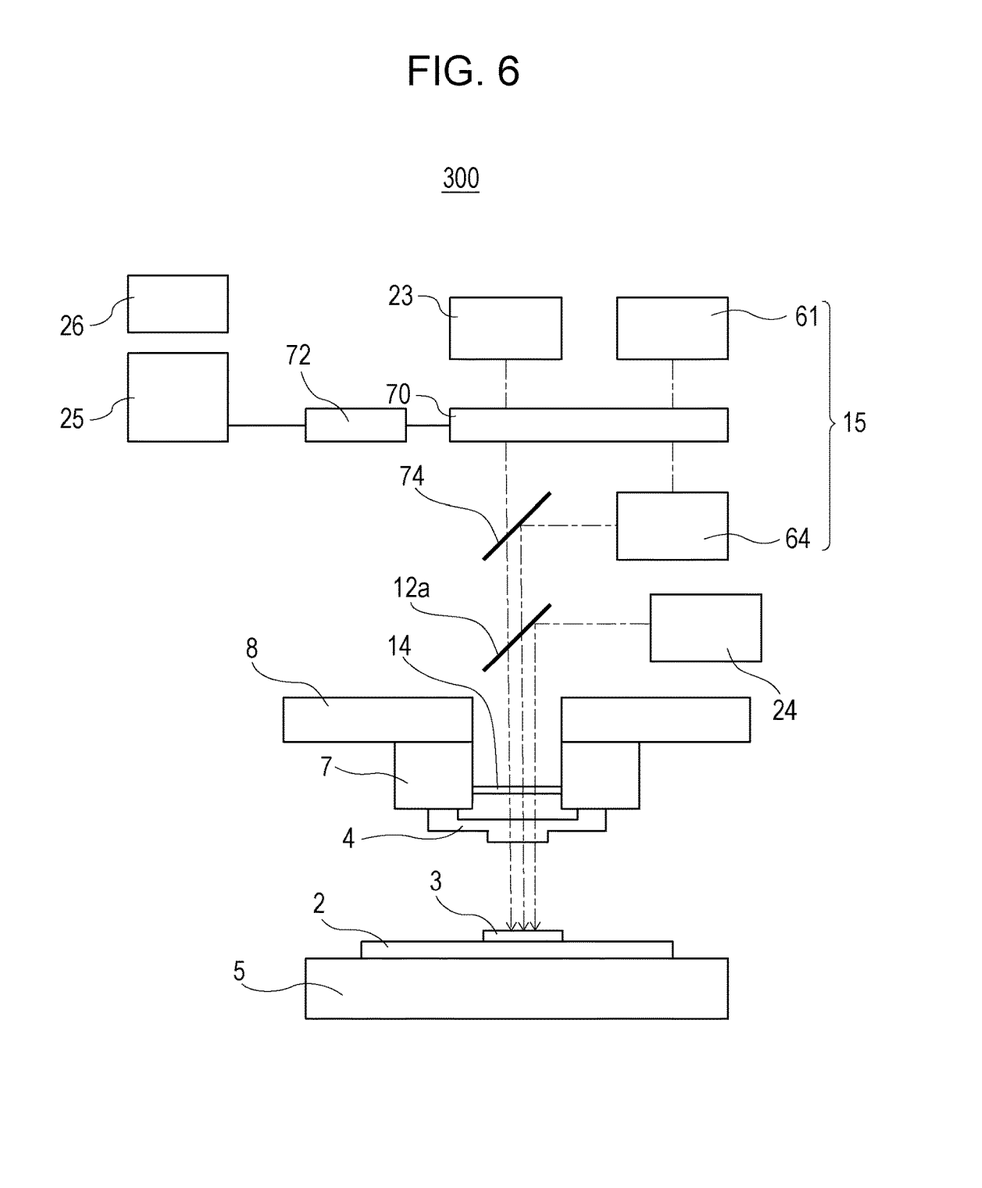
FIG. 6 illustrates a configuration of an imprint apparatus of a third exemplary embodiment.

FIG. 6 illustrates a configuration of an imprint apparatus 300 according to a third exemplary embodiment. The imprint apparatus 300 has a mirror 74 serving as a combining member which combines the observation light emitted by the light source 23a and the heating light from the heating mechanism 15 and guides the observation light and the heating light to the pattern region 31. Furthermore, the imprint apparatus 300 has a light shielding member 70 capable of shielding the heating light and the observation light and a driving unit 72 which drives the light shielding member 70. Illustration of the illumination unit 10 is omitted.

The driving unit 72 is connected to the control unit 25, and the driving unit 72 drives the light shielding member 70 based on an instruction of the control unit 25 to selectively shield the observation light directed to the pattern region 31 and the heating light directed to the pattern region 31. As to the heating mechanism 15, only the light source 61 and the DMD 64 are illustrated, and illustration of the other optical systems is omitted. The other configurations are similar to those of the first exemplary embodiment.

The mirror 74 is a mirror which transmits a part of the heating light and reflects a part thereof. The mirror 74 is also a mirror which transmits a part of the observation light and reflects a part thereof. The mirror 74 is desired to have a function of guiding the heating light incident on the mirror 74 to the pattern region 31 with 70% or more of illumination maintained.

Figure 7:
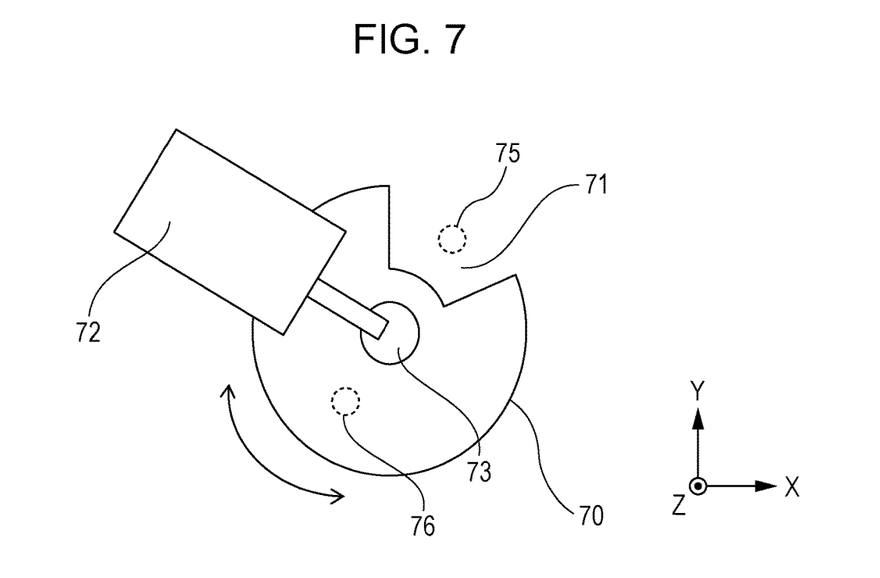
FIG. 7 illustrates a configuration of a light shielding member and a driving unit.

FIG. 7 illustrates a configuration of the light shielding member 70 and the driving unit 72. The light shielding member 70 is a circular plate member, and has an opening part 71 through which light is able to pass. The driving unit 72 rotates the light shielding member 70 on a plane along a light shielding plane of the light shielding member 70 (X-Y plane) around a rotation axis 73. A position 75 is the optical path of the observation light and a position 76 is the optical path of the heating light.

The driving unit 72 moves a position of the opening part 71 to thereby switch light to be shielded by the light shielding member 70. FIG. 7 illustrates a state where the light shielding member 70 transmits the heating light and shields the observation light. When the light shielding member 70 is rotated by 180° from the state of FIG. 7, the light shielding member 70 transmits the observation light and shields the heating light.

The rotation axis 73 is desired to be at a center position of the position 76 which is the optical path of the heating light and the position 75 which is the optical path of the observation light (between the optical path of the heating light and the optical path of the observation light). This makes it possible to prevent a diameter of the light shielding member 70 from increasing and to reduce a weight of the light shielding member 70. In addition, it is possible to rotationally drives the light shielding member 70 with a small force compared with a case where rotation axis 73 is arranged different position from a position between the optical path of the heating light and the optical path of the observation path.

The driving unit 72 drives the light shielding member 70 in accordance with a timing of imprint processing. Description will be given for relationships between the timing of the imprint processing and a driving method of the light shielding member 70 by using FIG. 8 to FIG. 10.

Figure 8:
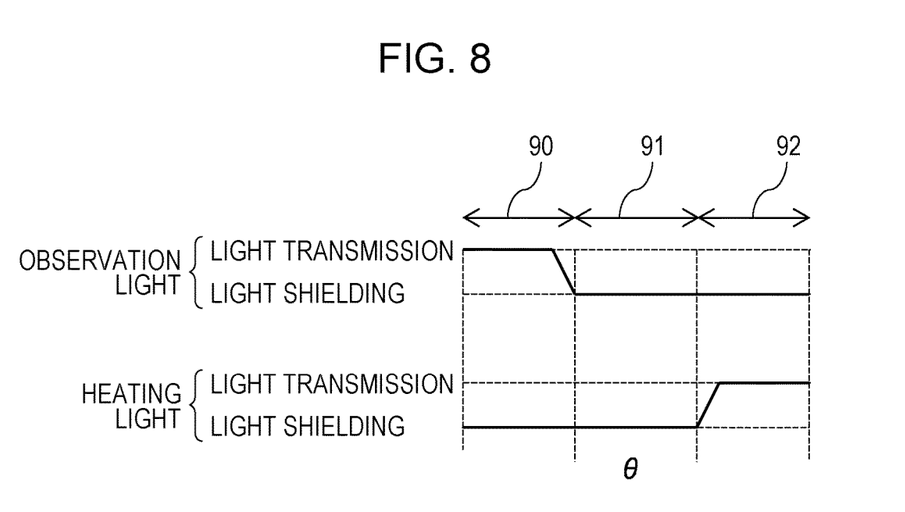
FIG. 8 is a diagram for explaining driving of the light shielding member.
Figure 9A:
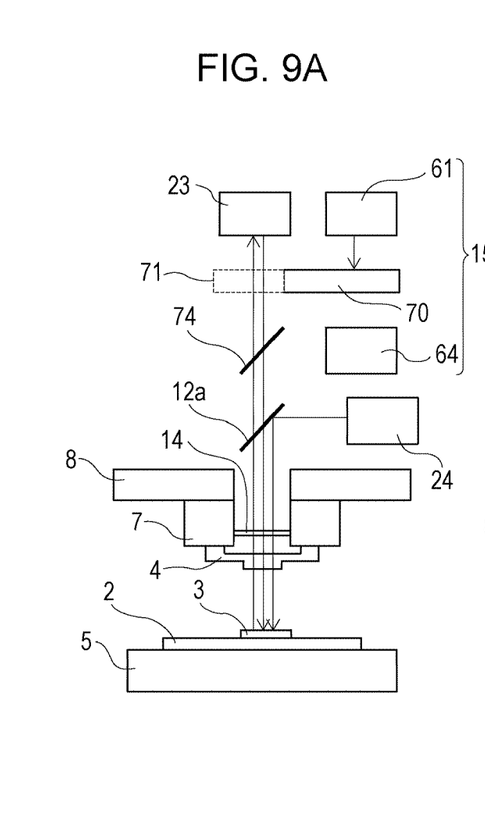
FIGS. 9A to 9C are diagrams for explaining differences of optical paths according to positions of the light shielding member.
Figure 9B:
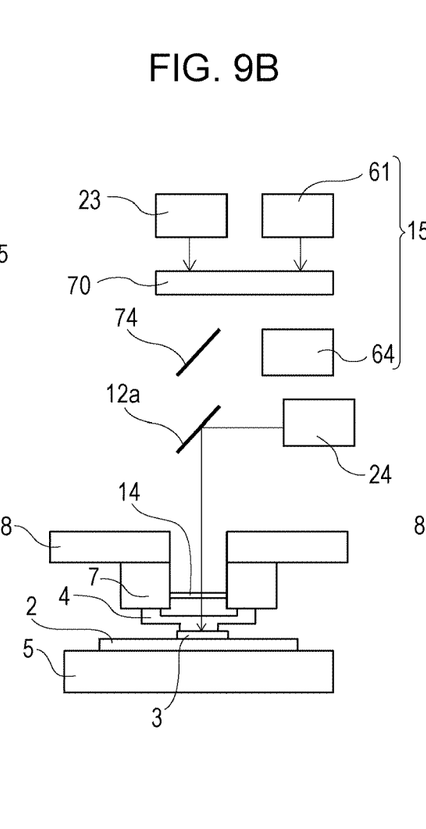
Figure 9C:
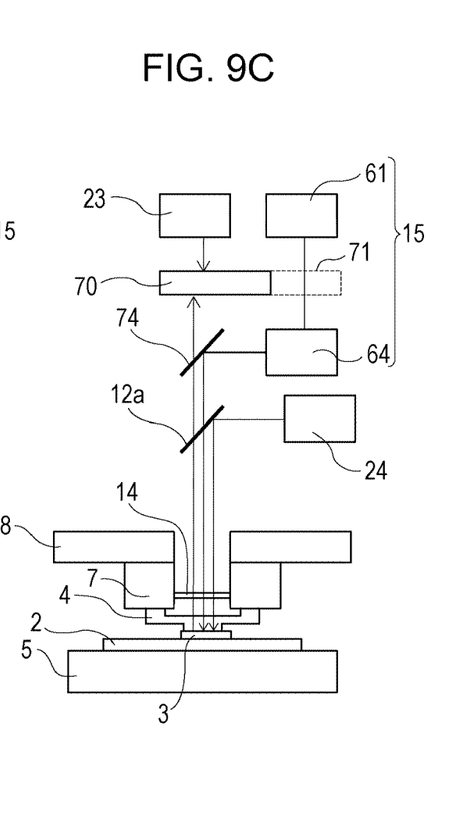
Figure 10:
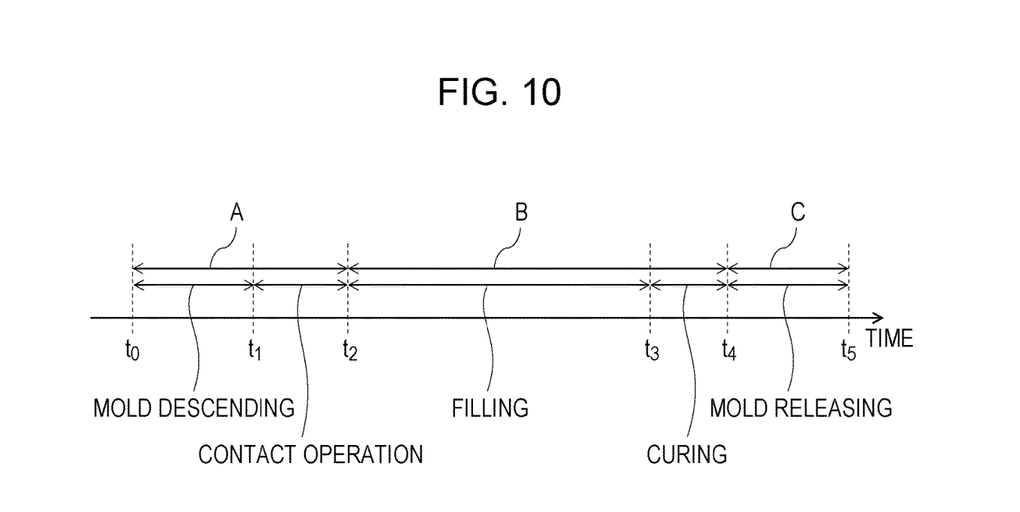
FIG. 10 is a diagram for explaining imprint processing and positions of the light shielding member.

FIG. 8 is a diagram for explaining driving of the light shielding member 70. A lateral axis indicates a rotation angle of the light shielding member 70, and a state of each of the observation light and the heating light is indicated. FIGS. 9A to 9C are diagrams for explaining differences of optical paths according to positions of the light shielding member 70. FIG. 10 is a diagram for explaining the imprint processing and the positions of the light shielding member 70.

A timing t0 is a timing for starting descending the mold 4. During a period from the timing t0 to a timing t1, the mold 4 is performing a descending step.

The timing t1 indicates a timing when the imprint material 3 starts a contact. In a case where knowledge has been obtained in advance, the timing t1 may be a scheduled timing of starting the contact. A timing t2 indicates a timing when the pattern portion 4a is set in a direction along the substrate 2. The timing t2 may be a timing when a spread of the imprint material 3 reaches an outer periphery of the pattern portion 4a. The timing t2 may be a scheduled timing similarly to the timing t1.

A period from the timing t1 to the timing t2 indicates a step of a contact operation of expanding a contact region of the pattern portion 4a and the imprint material 3. During a period from the timing t0 to the timing t2 (section A), the light shielding member 70 is arranged so as to transmit the observation light and shield the heating light (section 90 of FIG. 8, and FIG. 9A).

A period from the timing t2 to a timing t3 indicates a step at which a concave of a concave-convex pattern formed on the pattern portion 4a is filled with the imprint material 3. After the filling is finished, during a period from the timing t3 to a timing t4, the ultraviolet rays 11 are illuminated to the pattern region 31 to cure the imprint material 3.

By rotating the light shielding member 70 at a predetermined timing during a period from the timing t2 to the timing t4 (section B), light to be transmitted is switched from the observation light to the heating light. Thereafter, the heating mechanism 15 illuminates the pattern region 31 with the heating light to thermally deform the pattern region 31. The light shielding member 70 is therefore arranged at a position where the observation light is shielded and the heating light is transmitted (section 92 of FIG. 8, and FIG. 9C).

During a short time until the opening part 71 is switched from the position 75 to the position 76, the observation light and the heating light are shielded by the light shielding member 70 (section 91 of FIG. 8, and FIG. 9B). It is possible to prevent the heating light from reaching the receiving unit 23b even in a case where the light shielding member 70 stops in the middle of the switching due to a malfunction or the like. This makes it possible to prevent the receiving unit 23b from being damaged. Note that, in the sections A, B, and C which are indicated in FIG. 10, illustration of times required for driving the light shielding member 70 (times required for switching) is omitted.

A period from the timing t4 to a timing t5 indicates a time of mold releasing step of releasing the mold 4 from the imprint material 3 and ascending the mold 4. The timing t4 may be a timing when it is detected that the imprint material 3 finishes being cured, or may be a timing set by including an illumination time for a margin during which the ultraviolet rays 11 are excessively illuminated after the imprint material 3 finishes being cured. During the period from the timing t4 to the timing t5 (section C), the light shielding member 70 is again arranged at the position where the observation light is transmitted and the heating light is shielded (section 90 of FIG. 8, and FIG. 9A).

During a time period except a period from the timing t1 to the timing t5, the light shielding member 70 may shield any of the heating light and the observation light. At least the heating light is desired to be shielded.

In this manner, including the light shielding member 70 and the driving unit 72 is advantageous when the heating mechanism 15 which thermally deforms the pattern region 31 and the observing portion 23 which observes the pattern region 31 are used together. That is, it is possible to prevent (or reduce) damage of the receiving unit 23b due to the heating light reaching the receiving unit 23b.

Note that, light "shielding" by the light shielding member 70 may not be a property of making transmittance of incident light be 0%. For example, a state where the heating light is slightly incident on the receiving unit 23b is regarded as a state where the light shielding member 70 shields the heating light, provided that an observing property is not damaged so that an image is not able to be observed by the observing portion 23.

Note that, a liquid crystal shutter whose transmittance of light having a predetermined wavelength is variable may be used as the light shielding member 70. In the case of using the liquid crystal shutter, neither the opening part 71 nor movement of the light shielding member 70 in a rotation direction is necessary.

Fourth Exemplary Embodiment

Figure 11:
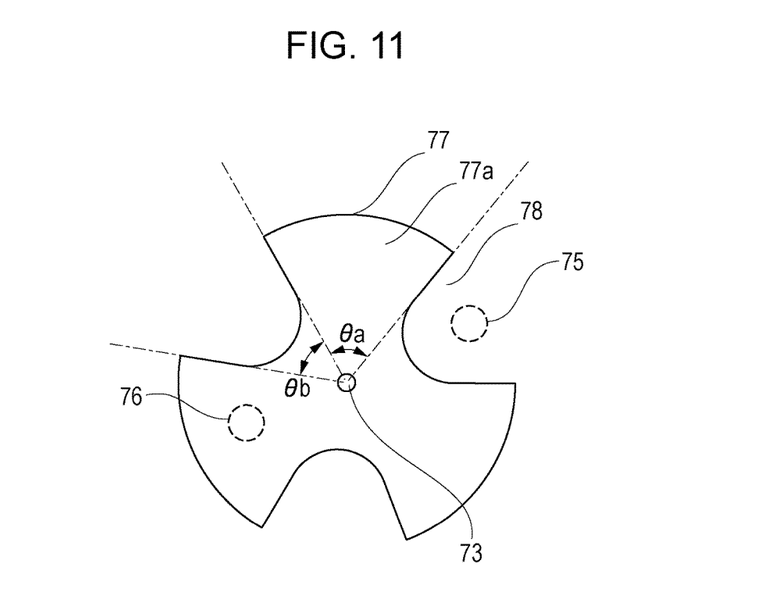
FIG. 11 illustrates a configuration of a light shielding member of a fourth exemplary embodiment.

Instead of the light shielding member 70, a light shielding member 77 illustrated in FIG. 11 may be used. In the light shielding member 77, opening parts 78 each having an equal angle are formed at three sites. This makes it possible to shield at least one of the observation light and the heating light in an angle range of 120° at the maximum. It is possible to shorten a time required for switching.

In addition, by forming the opening parts 78 at positions deviated from each other by 60°, a centroid of the light shielding member 77 is matched with the position of the rotation axis 73. Thereby, stability when the light shielding member 77 is rotated by the driving unit 72 is improved compared with a case where the opening part 71 is provided at one site. An angle θa of a region 77a on a light shielding plane and an angle θb of the opening part 78 are desired to satisfy a relationship of θa>θb, so that the light shielding plane of the light shielding member 77 has a region capable of shielding both of the observation light and the heating light.

Fifth Exemplary Embodiment

Figure 12A:
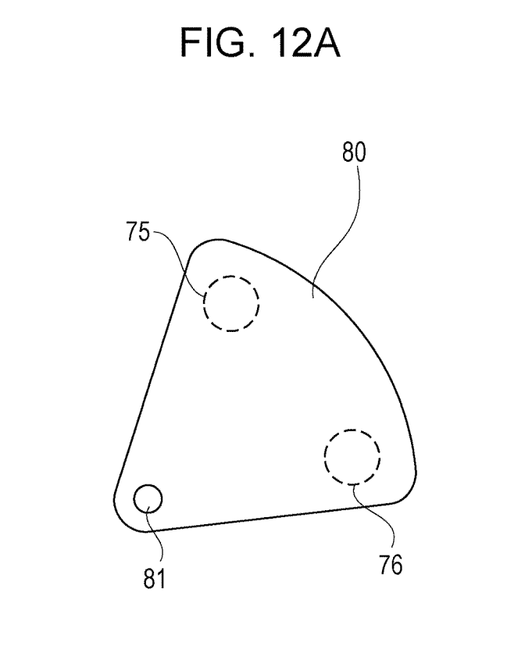
FIGS. 12A, 12B, and 12C illustrate a configuration of a light shielding member of a fifth exemplary embodiment.
Figure 12B:
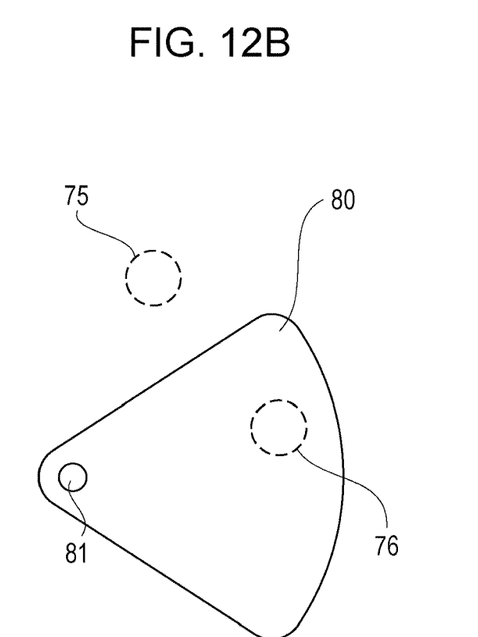
Figure 12C:
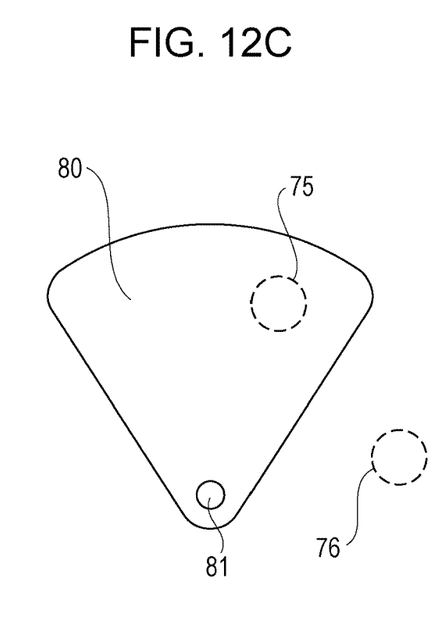

Instead of the light shielding member 70, a light shielding member 80 illustrated in FIG. 12 may be used. The driving unit 72 drives the light shielding member 80 in a rotation direction around a rotation axis 81. This makes it possible to perform switching between a state where the observation light and the heating light are shielded (FIG. 12A), a state where only the heating light is shielded and the observation light is transmitted (FIG. 12B), and a state where only the observation light is shielded and the heating light is transmitted (FIG. 12C).

Other Exemplary Embodiment

The standard illumination profile may be common between the pattern regions 31 or may be different for each of the pattern regions 31. The description has been given by exemplifying a case where the pattern region 31 is one shot region. However, the pattern region 31 is not limited thereto and may have a size corresponding to a plurality of shot regions, for example.

For the imprint material, a curable composition (also referred to as resin in an uncured state) which is cured when energy for curing is applied is used. As the energy for curing, an electromagnetic wave, heat, and the like are used. The electromagnetic wave is light, such as infrared rays, visible light rays, and ultraviolet rays, whose wavelength is selected from a range of 10 nm or more to 1 mm or less, for example.

The curable composition is a composition which is cured by illumination of light or heating. The photo-curable composition which is cured by light may contain at least a polymerizable compound and a photopolymerization initiator, and may contain a non-polymerizable compound or a solvent as necessary. The non-polymerizable compound is at least one selected from a group composed of a sensitizer, a hydrogen donor, an internal mold release agent, surface activating agent, antioxidant, a polymer component, and the like.

The imprint material 3 is applied in a film shape on the substrate by a spin coater or a slit coater. Alternatively, the imprint material 3 may be applied, by a liquid jetting head, onto the substrate in a droplet shape or in an island shape or a film shape formed of a plurality of droplets connected with each other. A viscosity of the imprint material 3 (viscosity at 25° C.) is, for example, 1 mPa·s or more and 100 mPa·s or less. When a thermally curable imprint material is selected, however, the imprint material 3 is to be material whose curing temperature is out of a temperature range of the substrate, which fluctuates due to heating for shape correction.

[Method for Producing Article]

A pattern of a cured composition formed by using the imprint apparatus is used permanently for at least a part of various articles or temporarily when producing various articles.

The article is an electric circuit element, an optical element, an MEMS (Micro Electro Mechanical Systems), a recording element, a sensor, a mold, or the like.

Examples of the electric circuit element include volatile or non-volatile semiconductor memories such as a DRAM (dynamic random access memory), a SRAM (Static Random Access Memory), a flash memory, and a MRAM (Magnetoresistive Random Access Memory), and semiconductor devices such as an LSI (large scale integration), a CCD (Charge Coupled Device), an image sensor, and an FPGA (field-programmable gate array).

An example of the mold includes a mold for imprint.

The pattern of the cured composition is directly used as at least a part of constituent members of the article or temporarily used as a resist mask. After etching, ion implantation or the like is performed at a step of processing the substrate, the resist mask is removed. The step of processing may further include other known steps of processing (oxidation, film formation, vapor deposition, flattening, detachment of the imprint material, dicing, bonding, packaging, or the like).

Though description has been given for suitable exemplary embodiments of the invention as above, it is needless to say that the invention is not limited to the exemplary embodiments, and various modifications and changes are able to be made within the scope of the gist.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-117798, filed on Jun. 10, 2015, and Japanese Patent Application No. 2016-087315, filed on Apr. 25, 2016, which are hereby incorporated by reference herein in their entirety.

What is claimed is:

1. An imprint apparatus which forms a pattern of an imprint material in a region on a substrate by using a mold, comprising:
    a first optical member configured to guide first and second lights to the region;
    a first light source configured to emit the first light by means of the first optical member to the region to observe the region;
    a second light source configured to emit the second light having a first wavelength by means of the first optical member to the region to deform the region;
    a third light source configured to emit a third light having a second wavelength to cure the imprint material on the deformed region;
    a light shielding member configured to selectively shield the first light and the second light; and
    a driving unit which drives the light shielding member,
    wherein the second and third light sources are different, and the first wavelength is longer than the second wavelength.

2. The imprint apparatus according to claim 1, wherein the first optical member is a dichroic mirror.

3. The imprint apparatus according to claim 1, wherein the first optical member is a mirror which transmits a part of incident light and reflects residual light in a predetermined direction.

4. The imprint apparatus according to claim 1, wherein, during a contact operation of making the mold and the imprint material contact with each other, the light shielding member is driven so that the light shielding member shields the second light and does not shield the first light.

5. The imprint apparatus according to claim 1, wherein, during a predetermined time period in a period until curing of the imprint material by the third light source is finished after a contact operation is finished, the driving unit drives the light shielding member so that the light shielding member shields the first light and does not shield the second light.

6. The imprint apparatus according to claim 4, wherein, during a predetermined time period in a period until curing of the imprint material the third light source is finished after the contact operation is finished, the driving unit drives the light shielding member so that the light shielding member shields the first light and does not shield the second light.

7. The imprint apparatus according to claim 1, wherein the light shielding member has an opening part, and the driving unit moves a position of the opening part to thereby switch light to be shielded by the light shielding member.

8. The imprint apparatus according to claim 1, wherein the driving unit is a driving unit which rotates the light shielding member around a rotation axis, and a position of the rotation axis on a plane along a light shielding plane of the light shielding member is between an optical path of the first light and an optical path of the second light.

9. The imprint apparatus according to claim 1, further comprising a second optical member which has a property that transmittance of the first light is higher than transmittance of the second light and which is arranged on an optical path of the first light.

10. The imprint apparatus according to claim 9, wherein the second optical member includes a band pass filter.

11. The imprint apparatus according to claim 1, further comprising an observing unit configured to observe a state of the imprint material between the mold and the region to be processed by using the first light.

12. The imprint apparatus according to claim 1, wherein the first wavelength has a range from 400 nm to 2,000 nm.

13. The imprint apparatus according to claim 1, wherein the second wavelength has a range from 300 nm to 380 nm.

14. The imprint apparatus according to claim 1, further comprising
   a second optical element configured to pass one of the second and third lights, and reflect the other of the second and third lights.

15. The imprinting apparatus according to claim 1, further comprising:
   a second optical element configured to pass the second light, and reflect the third light,
   wherein the region is deformed by the passed second light, and the imprint material is cured by the reflected third light.

16. The imprint apparatus according to claim 1, further comprising
   a second optical element configured to receive the second and third lights from different optical paths; and
   wherein the second optical element is configured to guide the received first and second lights to a same optical path.

17. The imprint apparatus according to claim 1, wherein the light shielding member takes one of three states: a first state to shield the first light and transmit the second light, a second state to transmit the first light and shield the second light, and a third state to shield both the first light and the second light.

\* \* \* \* \*